（12） United States Patent
Naura

(10) Patent No.: US 6,275,413 B1
(45) Date of Patent: Aug. 14, 2001

(54) ARCHITECTURE OF A NON-VOLATILE ELECTRICALLY ERASABLE AND PROGRAMMABLE MEMORY

(75) Inventor: David Naura, Aix en Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/657,319

(22) Filed: Sep. 7, 2000

(30) Foreign Application Priority Data

Sep. 16, 1999 (FR) .................................................. 99 11600

(51) Int. Cl.[7] ...................................... G11C 7/00

(52) U.S. Cl. ........................................ 365/185.05; 365/51

(58) Field of Search ............................... 365/51, 185.01, 365/185.05, 45

(56) References Cited

U.S. PATENT DOCUMENTS 4,627,027 * 12/1986 Rai et al. ............................... 365/45

FOREIGN PATENT DOCUMENTS 801398   10/1997 (EP) ............................... G11C/27/00

* cited by examiner

Primary Examiner—Terrell W. Fears
(74) Attorney, Agent, or Firm—Theodore E. Galanthay; Allen, Dyer, Doppelt, Milbrath & Gilchrist, P.A.

(57) ABSTRACT

In a EEPROM memory architecture organized into word columns that includes n memory cells per word column, there is, for each word of the column, one diffusion line to connect sources of the memory cells to a ground connection transistor using a source line. A word read access includes simultaneously selecting the word accessed in a read mode in a first group of memory cells, and an additional word in the second group of memory cells. Each column has n bit lines ranked 0 to n−1, each connected to the same ranked cells in the first group of memory cells. The connection of each of the n cells ranked 0 to n−1 in the second group of memory cells to one of the n bit lines of the column are such that a length of connection between a source of a memory cell connected to an i ranked bit line in the second group of memory cells to a respective second diffusion connection corresponds to a length of connection between a source of a memory cell connected to an (n−1)-i ranked bit line in the first group of memory cells to a respective first diffusion connection.

25 Claims, 6 Drawing Sheets

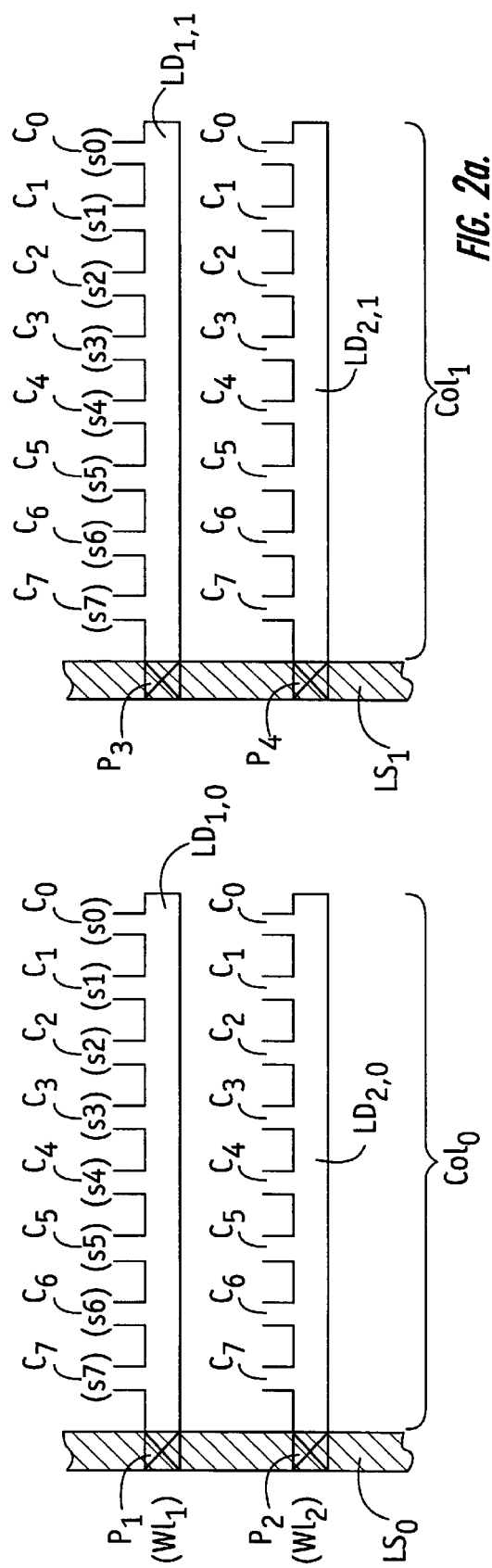
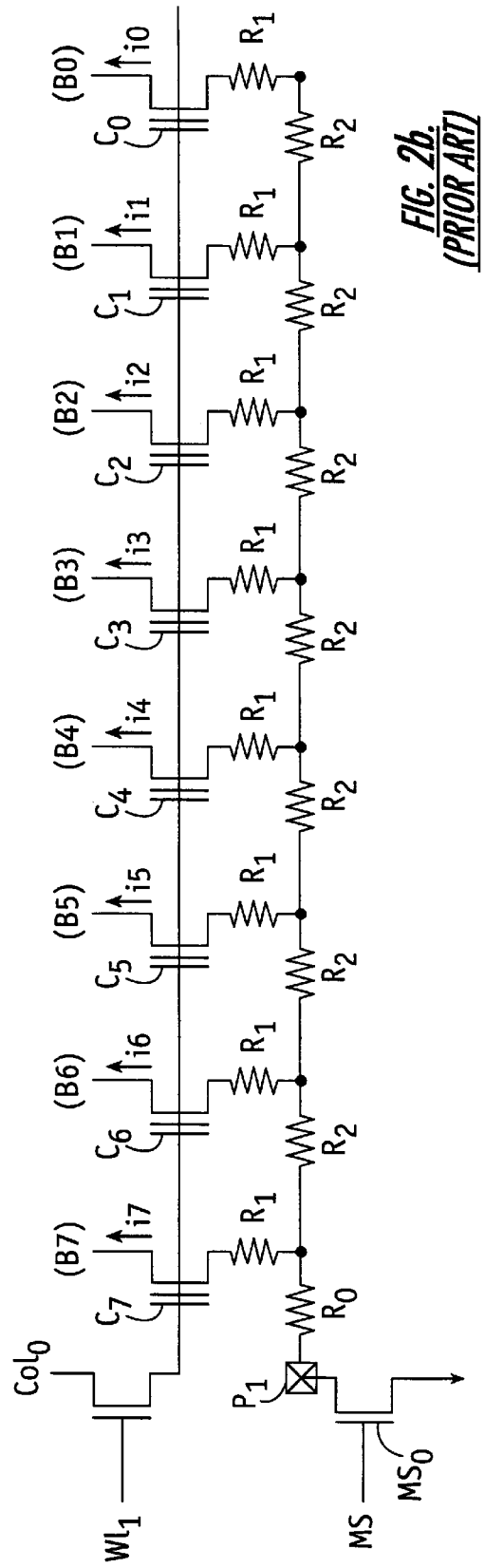
FIG. 2a. (PRIOR ART)
FIG. 2b. (PRIOR ART)

ARCHITECTURE OF A NON-VOLATILE ELECTRICALLY ERASABLE AND PROGRAMMABLE MEMORY

FIELD OF THE INVENTION

The present invention relates to integrated circuits, and, more particularly, to an architecture of an electrically erasable programmable non-volatile memory, especially a EEPROM or a flash EPROM.

BACKGROUND OF THE INVENTION

EPROMS are memories well known to those skilled in the art. Each cell includes at least one floating-gate transistor and one access transistor. According to the usual matrix architecture of memories, each cell is controlled by a bit line and a word line of the memory. Each cell can thus be read or written individually by the selection of the corresponding bit line and word line.

It is also common practice to provide for a word access to the memory. Many data elements in applications are encoded not on one bit alone, but on several bits. The common memory architectures thus provide for the possibility of simultaneously accessing several bits, typically 8, 16 or 32 bits. In all cases, the basic unit in terms of a memory word is the byte, formed by eight bits. Most memory architectures are based on the byte.

In practice, the eight bits of a byte are located on the same word line. In the case of a 16-bit memory, the memory array is generally divided into two. A 16-bit word is formed by one byte in one half-array and by another byte in the other half-array. Because of the large memory capacities that are being sought, a word line provides access to several bytes. For example, it is possible to have 128 bit lines for 128 word lines. Each word line thus contains 16 bytes.

To simultaneously select all the bits of a word of a word line, there is a provision for grouping the words of the memory into columns. The i ranking column is the one that comprises the word of the same rank in each word line. An architecture of this kind calls for additional access transistors, each making it possible to select a particular column of the memory. Depending on the specifications of the memory access operations, there are various architectures available to the designer.

One example of a memory architecture organized in word columns of n memory cells is shown in FIG. 1. This architecture provides one additional access transistor per word of the memory. If the memory has p word lines and N columns, there are p access transistors per column, i.e., one per word line, this gives a total of pxN additional access transistors, i.e., one per word. These additional access transistors receive a signal for the selection of the associated word line as well as a signal for the selection of the associated column. These signals are given by the address decoding circuit of the memory.

FIG. 1 shows a memory organized in word columns of n=8, memory cells $C_0$ to $C_7$ comprising p word lines $Wl_0$ to $Wl_{p-1}$, and N columns $Col_0$ to $Col_{N-1}$. Each column has eight bit lines B0 to B7, each connected to the same ranking cells of the words of the column.

Each memory cell has an access transistor Ta series-connected with a floating-gate transistor Tf. The access transistor Ta is connected at its gate to the corresponding word line and at its drain to the corresponding bit line. An additional column access transistor is planned per word. This column access transistor, for example, $Tc_{0,0}$, is connected at its gate to the corresponding word line $Wl_0$ and at its drain to the corresponding column selection line $Col_0$. At its source, it transmits a word selection line $Sel_{0,0}$, applied to the control gate of the floating-gate transistors of the cells $C_0$ to $C_7$ of the word considered.

Typical EEPROM memory architectures comprise source lines to draw the sources of the memory cells to ground, especially for reading. In the case of a word access memory architecture, one line source per column is provided. The source line $LS_0$ for the column $Col_0$ connects the sources of the floating-gate transistor of the memory cells of this column to a corresponding ground connection transistor $MS_0$.

Referring again to FIG. 1, there are N source lines $LS_0$ to $LS_{N-1}$ and N ground connection transistors $MS_0$ to $MS_{N-1}$, i.e., one per column. The number of these transistors depends typically on the memory architecture chosen by the designer, application constraints, and the design and drawing rules. It is thus possible to have a single ground connection transistor for the entire memory array, provided that it can let through all the current needed into the different access modes of the memory.

A problem that arises with the word access memory architectures is in the connection of the sources of the floating-gate transistors of the memory cells to a ground connection transistor that is outside the memory array. The sources of the memory cells are diffusions. The connection of these diffusions to a ground connection transistor must take account of the layout constraints related to the technology, and must use as little layout space as possible.

The aim is to obtain a small-sized and low cost finished product. One metal source line per column is typically used to connect the diffusion of the sources of the memory cells to the ground connection transistor. This source line must be located outside the layout zones of the memory cells so as not to add an additional metal layer level in the integrated circuit.

FIG. 2a shows the partial layout of the first two words of two consecutive word lines $WL_1$ and $WL_2$. This layout shows the making of one diffusion zone for each word. In the first column $Col_0$ of the memory, the diffusion zone $LD_{1,0}$ forms the source $s_0, \ldots, S_7$ of each of the floating-gate transistors of the memory cells $C_0$ to $C_7$ of the first word of the word line $Wl_1$. The diffusion zone $LD_{2,0}$ forms the source $s_0, \ldots, s_7$ of each of the floating-gate transistors of the memory cells $C_0$ to $C_7$ of the first word of the word line $Wl_2$.

In the second column $Col_1$ of the memory, the diffusion zone $LD_{1,1}$ forms the source $s_0, \ldots, S_7$ of each of the floating-gate transistors of the memory cells $C_0$ to $C_7$ of the second word of the word line $Wl_1$. The diffusion zone $LD_{2,1}$ forms the source $s_0, \ldots, S_7$ of each of the floating-gate transistors of the memory cells $C_0$ to $C_7$ of the second word of the word line $Wl_2$.

Each of these diffusion zones thus forms a diffusion line in a direction perpendicular to the sources. Each diffusion line is formed to a respective contact used to connect it to a metal source line of the associated, perpendicular column. The contact and the source line are made outside the layout zone of the memory cells of the column considered. In the example, for diffusion lines $LD_{1,0}$ and $LD_{2,0}$, there correspond respectively the contacts P1, P2 on the metal source line $LS_0$ of the column $Col_0$. To the diffusion line $LD_{1,1}$ and $LD_{2,1}$, there respectively correspond the contacts P3, P4 on the metal source line $LS_1$ of the column $Col_1$.

According to this layout, two successive columns are separated from each other by a metal source line. With a layout of this kind, there is a loss of current in the connection path of the sources at the ground connection transistor. The diffusion zones are resistive, and induce a considerable loss of current as a function of length. The amount of this loss of current varies for each cell within the same word.

Referring again to FIG. 2a, the cell $C_7$ of a word is connected to the source line by a smaller diffusion length than is the cell $C_0$ of the same word. Thus, the loss of current in the cell $C_7$ is smaller than in the cell $C_0$. In other words, the loss of current in a cell of a word, due to the diffusion length for connecting the source of this cell of a word to the corresponding source line, is a function of its rank in this word.

This loss of current is very troublesome, especially in the word read access mode. It may be recalled that the EEPROM memory cells, which are blank when they come off the production line, can then be electrically programmed. This lowers the threshold voltage of their floating-gate transistor. Alternatively, the EEPROM memory cells may be electrically erased, thus increasing this threshold voltage.

If the memory cells are read under voltage bias conditions such that a blank cell is conductive, the result thereof is that, in read mode, an erased cell is not conductive and a programmed cell is conductive. The principle of reading memory cells relies on the current/voltage conversion.

A differential amplifier is thus planned for each bit of the word to be read. This differential amplifier receives, at input, the current from the cell selected for reading and a reference current. This reference current is generally given by a reference memory cell that is a blank cell. The read bias conditions are such that the blank reference cell is conductive, and the cell in the programmed state conducts greater current while an erased cell is not conductive.

In a numerical example, the typical current values at 5 volts of the supply voltage will be:

$I_p$=50 microamps (programmed cell);

$I_v$=25 microamps (blank cell); and $I_e$=0 (erased cell).

Considering the case where the memory cells $C_0, \ldots, C_7$ of a word are all programmed, subjected to the same bias conditions in the read mode, then in theory they should all let through the same current. However, because of the different resistive path in each cell between the source and the ground connection transistor, there is a different current in each cell. The strongest current is in the cell that is geographically the closest to the source line, which is $C_7$ in the example. The lowest current is in the cell that is furthest away, which is $C_0$ in the example.

FIG. 2b gives a view, for the first word of the word line $W1_1$, of the equivalent resistors R0, R1 and R2 of the diffusion zone. Resistor R0 is for the part of the diffusion between the contact P1 and the source of the closest cell, which is $C_7$. Resistor R1 is for each part of the diffusion forming a source of a memory cell. Resistor R2 is for the diffusion parts between two consecutive sources.

If it is assumed that the cells $C_0$ to $C_7$ are in an identical state, i.e., all conductive (blank or programmed), then it is easy to compute the current in each cell. Assuming a=R2/R1 and i0 to be the current flowing through the cell $C_0$, current values are as follows:

$i1=i0+a \times i0$ $i2=i0+(3a+a^2) \times i0$ $i3=i0+(6a+5a^2+a^3) \times i0$ $i4=i0+(10a+15a^2+7a^3+a^4) \times i0$ $i5=i0+(15a+35a^2+28a^3+9a^4+a^5) \times i0$ $i6=i0+(21a+70a^2+84a^3+45a^4+11a^5+a^6) \times i0$ $i7=i0+(28a+126a^2+210a^3+165a^4+66a^5+13a^6+a^7) \times i0$ Thus, the maximum current difference is given by:

$\Delta I = i7 - i0 = (28a + 126a^{2+210}a^{3+165}a^{4+66}a^{5+13}a^6 + a^7)i0$, with a<1.

Since the current in the cells $C_0, \ldots, C_7$ in the same state (programmed for example) are not identical, the time for setting up each of the bits of a word to be read is not the same. This causes deterioration in the memory read access time, and reading may become impossible in an operational mode. Furthermore, at a low supply voltage, these currents are lower. The difference between several standard values also becomes smaller. For example, $I_p$ may decrease from a standard value to 20 microamps, and $I_v$ to 10 microamps. Depending on the position of the bit in the word to be read, the current of a program cell may become too close to the reference current, leading to an erroneous reading.

To overcome this problem of variation of the programming current between the cells of a word to be read due to the resistivity of the diffusion line, it is proposed in the prior art to use a double-word architecture. The basic idea of this approach is to increase the mean value (or standard value) of the programming current. Thus, the variations have a lower effect on the reading in terms of reliability and access time.

The general principle is thus as follows. When a word is selected in the read mode, a second word is automatically selected to recover twice the current of a cell on each bit line. Thus, an increase is obtained in the difference between the programmed state and the erased state as compared with the reference, so that the differential reading is made more reliable. The implementation of this approach is particularly simple for 8-bit memories.

It is a common practice to use the memory array of 16-bit memories in which a half-array is disabled to obtain 8-bit memories. To implement the approach of the prior art, it is enough to enable the second half-array in the read mode by a word and modify the decoder to obtain the automatic selection of a word in a second half-array when the word is accessed in read mode in the first half-array. It must be furthermore planned that the cells of the second half-array will all be in the same state, either erased or programmed or blank.

Considering only the programmed cells, at the level of each bit line, twice the current of a cell is recovered, giving:

$I(B0)=2i0$ $I(B1)=2i1=2i0+(2a)i0$ $I(B2)=2i2=2i0+(6a+2a^2)i0$ $I(B3)=2i3=2i0+(12a+10a^2+2a^3)i0$ $I(B4)=2i4=2i0+(20a+30a^2+14a^3+2a^4)i0$ $I(B5)=2i5=2i0+(30a+70a^2+56a^3+18a^4+2a^5)i0$ $I(B6)=2i6=2i0+(42a+140a^2+168a^3+90a^4+22a^5+2a^6)i0$ $I(B7)=2i7=2i0+(56a+252a^2+420a^3+330a^4+132a^5+26a^6+2a^7)i0$.

However, the amplitude of the current variation is doubled: $I(B7)-I(B0)=56a+252a^2+420a^3+330a^4+132a^5+26a^6+2a^7=2\Delta I$.

In theory, if the additional word automatically selected in the read mode contains programmed cells, it is possible to obtain the following read currents: $I_p$=100 microamps under a 5 volt supply, $I_p$=50 microamps under a 2.5 volt supply, $I_v$ is unchanged, and $I_e$ always equals 0. However, the increase in current is limited by the ground connection transistor, especially at a low supply voltage. The current flowing into the cells is not doubled. This current is increased only slightly, so much so that this approach proves to be inadequate.

All that has been explained with reference to an EEPROM can be applied equally well to a flash EPROM type memory whose architecture comprises blocks of memory cells with a common source line. More generally, it can be applied to a non-volatile memory of the electrically erasable and programmable type.

In the prior art, the mean value of the read current is increased for reading the bits of the word to be read. Thus, the maximum difference between the read currents undergoes little or no change. It is the difference with the reference current that is increased.

SUMMARY OF THE INVENTION

In view of the foregoing background, it is therefore an object of the present invention to provide an architecture of an electrically erasable and programmable non-volatile memory in which the reading of words is improved. The architecture reduces the amplitude of variation of the read currents.

This and other objects, features and advantages in accordance with the present invention are provided by an architecture of an electrically erasable and programmable non-volatile memory organized in columns of words of n memory cells comprising, for each column a diffusion line connects sources of the memory cells to a ground connection transistor by a metal source line for each word.

Each column further includes a first group of word lines and a second group of word lines. The second group is such that, in each column, the read access to a specified word in the first column leads to the simultaneous selection of a corresponding word in the second group. Each column also includes n bit lines ranked 0 to n−1. The n cells with the rank 0 to n−1 of the words of the first group are each connected to the same-ranking bit line.

According to the present invention, this architecture implements the connection of each of the n cells, ranked 0 to n−1, of the words of the second group to one of the n bit lines of the column. The length of diffusion connection to a metal source line of the cells of the same rank of the words of the second group that are connected to the i ranking bit line corresponds to the length of diffusion connection to a metal source line of the n−1−i ranking cells of the words of the first group.

In a first variation, implementation of the connection comprises the same bit line per column for the same ranking cells of the words of the first and second groups, and two metal source lines. A metal source line for each of the groups placed on either side of the layout zone of the column. The diffusion lines of the words of each group are connected to the corresponding metal source line.

In a second variation, the implementation of the connection comprises a metal source line for each column placed outside the layout zone of the column to connect the diffusion lines of the words of the two groups to a ground connection transistor. There are n bit lines ranked 0 to n−1 per group. Each of the n bit lines of a group are connected to the same-ranking cells in this group. A multiplexer is between the two groups to connect each of the n bit lines ranked 0 to n−1 of the first group to the bit line ranked n−1−i in the other group. Each of the first and second groups generally corresponds to a half-array of the memory.

BRIEF DESCRIPTION OF THE DRAWINGS

Other features and advantages of the present invention are described in detail in the following description, given by way of a non-restrictive example with reference to the appended drawings, of which:

FIG. 2a is a layout diagram of the sources and source lines of a word of the memory illustrated in FIG. 1;

FIG. 2b is a schematic diagram of the layout diagram illustrated in FIG. 2a;

DETAILED DESCRIPTION OF THE PREFERRED EMBODIMENTS

The invention is described in an application to a EEPROM, but can be applied more generally to an electrically erasable and programmable non-volatile memory. In the figures, the same elements are designated by the same references.

The memory is organized in columns of words and comprises a first group of word lines and a second group of word lines. The second group is reserved for a word read access to the first group, such that the read access to a specified word of the first group leads to the simultaneous selection, in the same column, of a corresponding word in the second group. Memories of this kind are known to those skilled in the art. The detailed principles of the memory layout will not be described in detail. Hereinafter, it is assumed that each group forms a half-array of the memory. This is the simplest and most common case.

Figure 1:
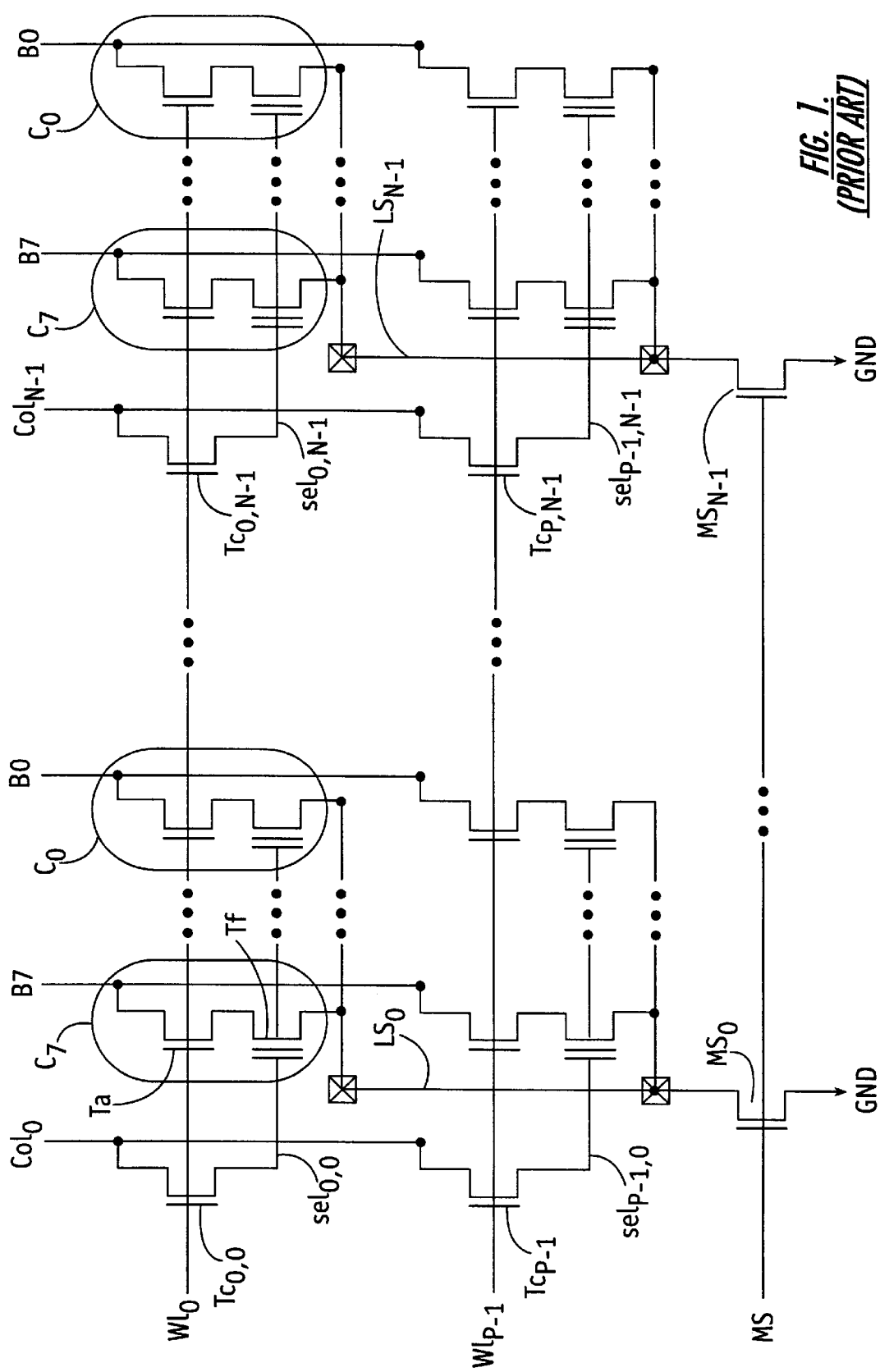
FIG. 1 is a schematic diagram of an architecture of a EEPROM memory with word access according to the prior art.
Figure 3:
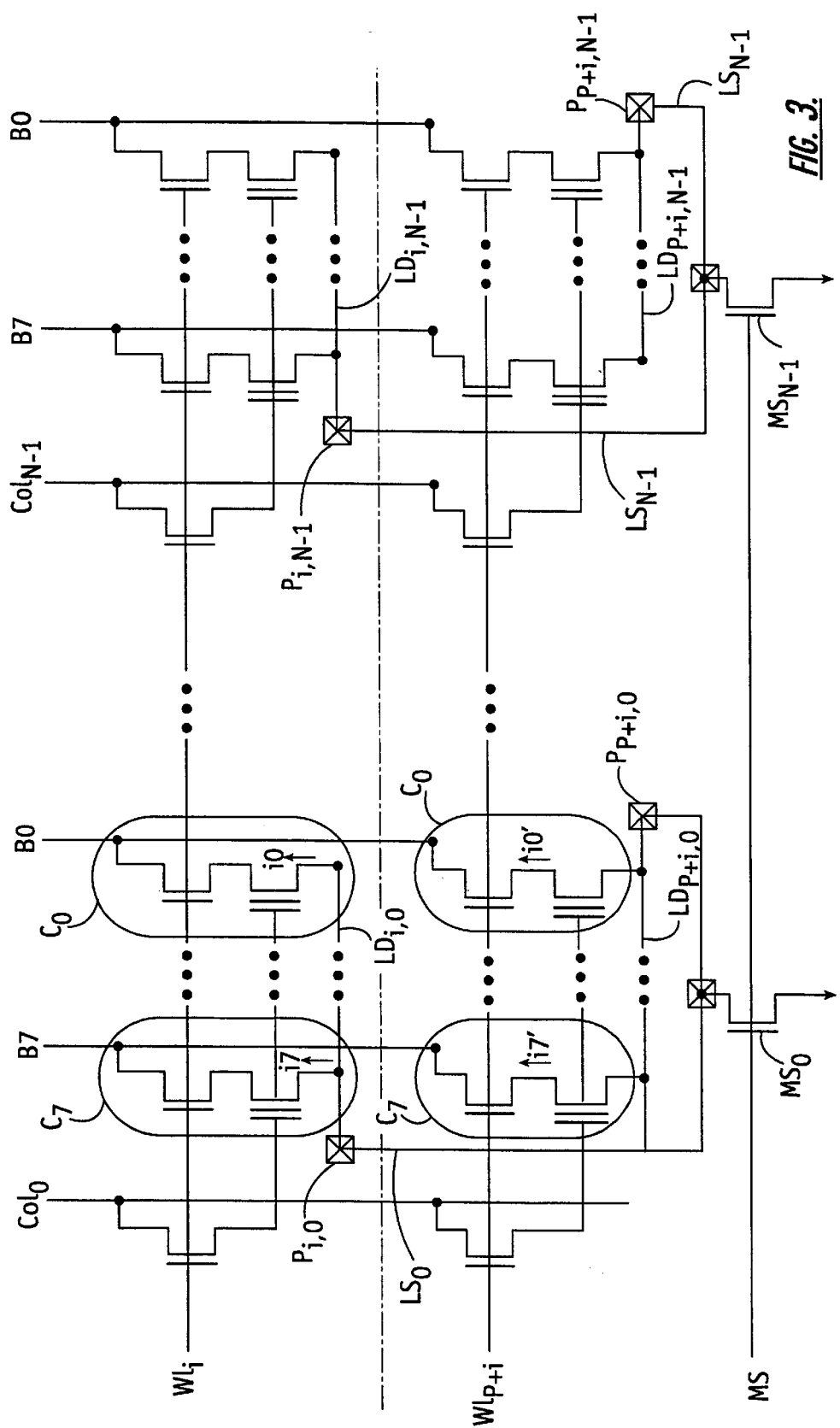
FIG. 3 is a schematic diagram of a memory architecture according to a first embodiment of the present invention.

FIG. 3 shows a first variation on implementation of the present invention. In this variation, the memory architecture generally includes, for each memory column, two metal source lines. One for each group (half-array) located on either side of the layout zone of the column. The diffusion line of each word of a group is connected to the corresponding source line.

In greater detail, the memory architecture illustrated in FIG. 3 comprises N memory columns $Col_0$ to $Col_{N-1}$, with eight bit lines B0 to B7 each. The memory array is formed by two half-arrays. The first half-array comprises p word lines $W1_0$ to $W1_{p-1}$, and contains the memory words available for the application. The second half-array comprises p word lines $W1_p$ to $W1_{2p-1}$, and contains the memory words used according to the invention for the word read access mode.

The first column contains p memory words in the first half-array and p memory words in the second half-array.

According to the present invention, when a word is accessed in the read mode, the decoder (not shown) selects the corresponding word line in the first half-array and, simultaneously, a corresponding word line in the second half-array. In one particularly straightforward decoding example, the i word line, $W1_i$, and the p+i word line, $W1_{p+i}$, are thus simultaneously selected in a read mode.

The first half-array is laid out as in the prior art. Each memory word of the first half-array, for example, the first memory word of the word line $W1_i$, has a diffusion line $LD_{i,0}$ to form the sources of the memory cells $C_0$ to $C_7$ and to make the connection to a contact $P_{i,0}$ on a source line $LS_0$ made of metal. This contact is made on one side, which is outside the layout zone of the column of memory cells. In the example shown, the source line and its contacts are located to the left of the layout zone of the memory column. This metal source line is connected to the drain of the associated ground connection transistor $MS_0$ in the source.

The second half-array is laid out like the first one except for the connection of the diffusion line of the sources to a contact on an associated metal source line. This second source line is located opposite the first one with respect to the layout zone of the column. This second source line is made of metal and is connected to the drain of the same ground connection transistor associated with the considered column.

Thus, considering the first word of the word line $W1_{p+i}$, its diffusion line $LD_{p+i,0}$ is connected to a contact $P_{p+i,0}$ on a metal source line $LS_0$ located outside the layout zone of the memory column. The diffusion line $LD_{p+i,0}$, on the side opposite the source line of the first half-array as shown in FIG. 3, is to the right of the layout zone of the memory column. In this way, each of the words of the first half-array is such that the cell $C_7$ is the closest to the source contact line, and the cell $C_0$ is the furthest. In the second half-array, this is the opposite. The cell $C_7$ is the furthest and the cell $C_0$ is the closest.

If i7 and i0 refer to the read current flowing in the cell $C_7$ and in the cell $C_0$ of a word of the first half-array, and i7' and i0' refer to the read current flowing in the cell $C_7$ and in the cell $C_0$ of the corresponding word selected simultaneously in the second half-array, then i0'=i7 and i7'=i0 if the symmetry is perfect.

In a word read mode, theoretically, at the bit line B7 concerned, there is a current equal to the sum of the currents flowing in the two concerned cells, namely I(B7)=i7+i7'= i7+i0. Similarly, for the bit line B0 concerned, there is a current equal to the sum of the currents flowing in the two concerned cells, namely I(B0)=i0+i0'=i0+i7. Thus, the currents in the two bit lines B7 and B0 are equal. Similarly, the currents in the two bit lines B6 and B1 are equal, the currents in the two bit lines B5 and B2 are equal, and the currents in the two bit lines B4 and B3 are equal.

Furthermore, it is shown that the amplitude of the current variation is lower than in the prior art. For a=R2/R1, wherein a<1 and i0 is the current passing in the cell $C_0$ of the words of the first half-array, the current values are as follows:

$$I(B0)=I(B7)=2i0+(28a+126a^2+210a^3+165a^4+66a^5+13a^6+a^7)i0$$

$$I(B1)=I(B6)=2i0+(22a+70a^2+84a^3+45a^4+11a^5+a^6)i0$$

$$I(B2)=I(B5)=2i0+(18a+38a^2+28a^3+9a^4+a^5)i0$$

$$I(B3)=I(B4)=2i0+(16a+20a^2+8a^3+a^4)i0$$

The maximum difference between the currents is then given by $I(B0)-I(B3)=I(B7)-I(B4)=(12a+106a^2+202a^3+164a^4+66a^5+13a^6+a^7)i0$. In the prior art, with a simultaneous selection of two words, this variation was equal to $2\Delta I=(56a+252a^2+420a^3+330a^4+132a^5+26a^6+2a^7)i0$. Thus, the maximum current variation is reduced by a ratio of over 4 in the first order according to the present invention.

Figure 4:
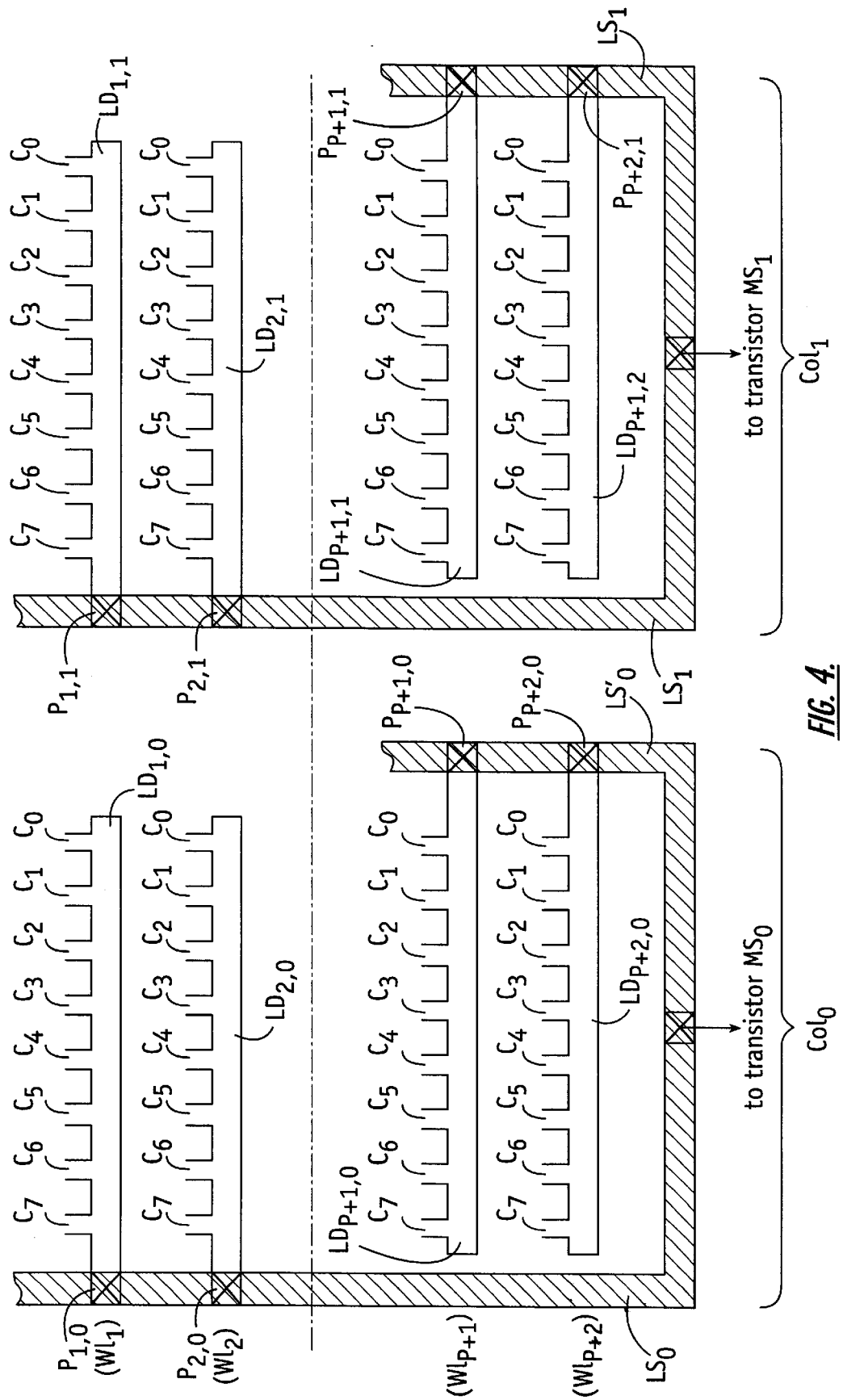
FIG. 4 is a layout diagram of the memory architecture illustrated in FIG. 3.

FIG. 4 illustrates the corresponding drawing of the partial layout of this architecture. It shows, for each of the first two memory columns $Col_0$ and $Col_1$, two metal source lines. There is a metal source line for each half-array located on either side of the layout zone of the memory column. This layout increases the physical space needed since two metal source lines are required per column.

Figure 5:
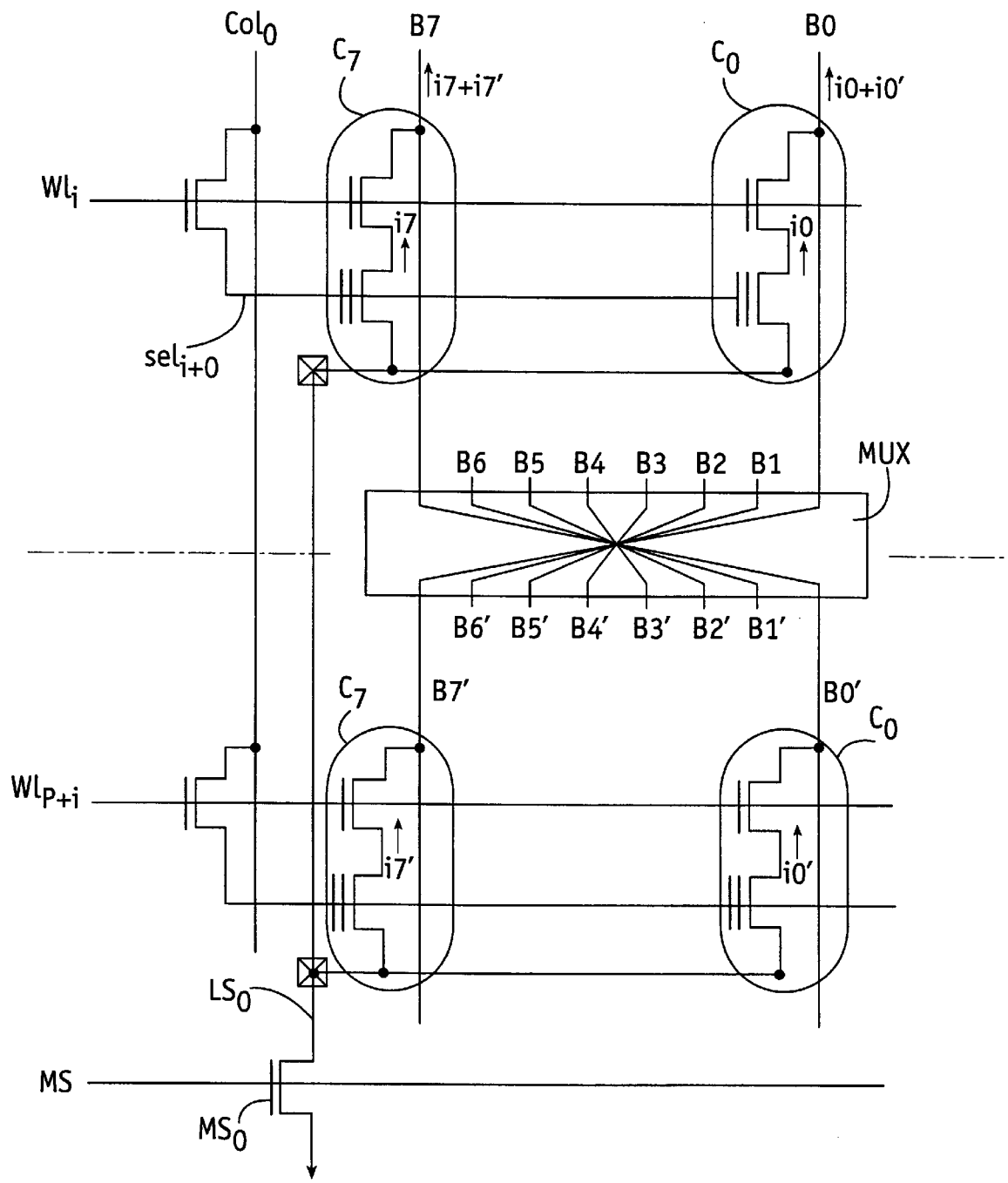
FIG. 5 is a schematic diagram of a memory architecture according to a second embodiment of the present invention.

FIG. 5 shows a second variation of an implementation of the present invention. In this variation, instead of having two metal source lines, one per half-array, on either side of the layout zone of the memory column with which they are associated, there is only one metal source line. In this architecture, there is planned for each column, n bit lines per half-array: B0 to B7 for the first one, and B0' to B7' for the second one. In each half-array, the n bit lines of each column, ranked 0 to n−1, are each connected to cells of the same rank.

A multiplexer MUX is between the two half-arrays to connect each of the bit lines of the first half-array to a bit line of the second half-array. In the word read access mode, the multiplexer for each column connects the i ranking bit line of the first half-array to the n−1−i ranking bit line of the second half-array, for i=0 to n−1.

In the example shown in FIG. 5, the bit line B0 is connected with the bit line B7', and so on until the bit line B7 is connected with the bit line B0'. The result obtained in terms of current is identical to that of the first variation.

Figure 6:
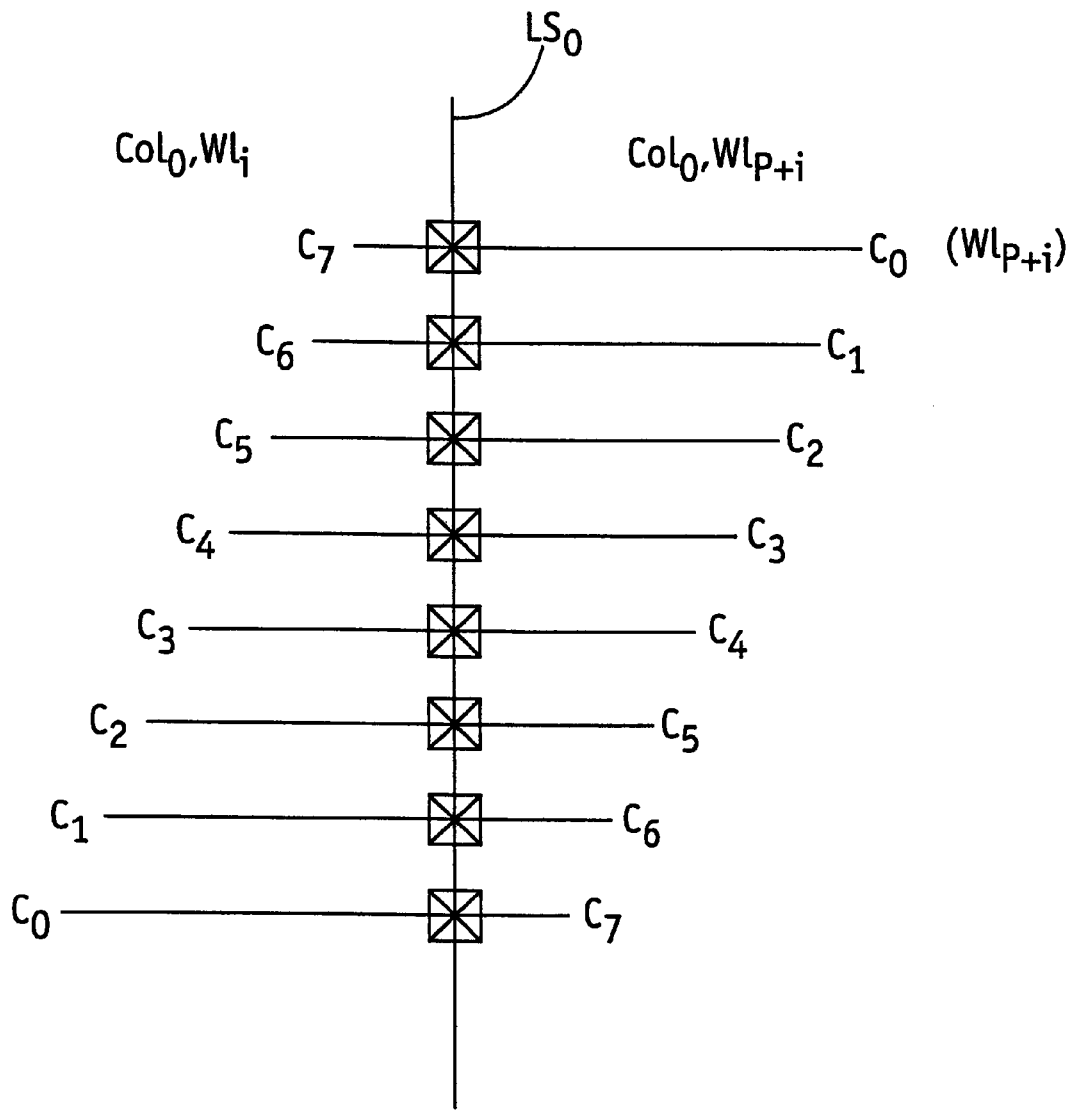
FIG. 6 is a layout diagram of a source line and corresponding word lines according to the second embodiment of the present invention.

FIG. 6 is a layout diagram illustrating the principle according to the second variation. For each column, such as column $Col_0$ in the example, the cell $C_7$ of the word line $W1_i$ of the first half-array corresponds to the cell $C_0$ of the word line $W1_{p+1}$ of the second half-array. Outside the word mode access mode, by default, either the bit lines of the second half-array will not be connected to the bit lines of the first half-array, or else they will be connected to the same-ranking bit lines. Alternatively, they may always be connected according to the scheme of the word read access mode.

The advantage of this second variation lies in the layout of the connections between the diffusion line and the source line which are identical in both half-arrays. The multiplexer is a logic element that does not occupy a lot of space.

In both variations, there are special layouts for the connection of each of the n cells, ranked 0 to n−1, of the words of the second group to one of the n bit lines B0 to B7 of the first group of the column. The length of diffusion connection to a source line of the same-ranking cells of the words of the second group that are connected to the i ranking bit line corresponds to the length of diffusion connection to a source line of the n−1−i ranking cells of the words of the first group.

The memory architecture according to the present invention may, by extension, cover the implementation of the reference cells. In the word read access mode, a word of reference cells is selected in the first group simultaneously with another word in the second group. The architecture according to the present invention then makes it possible to improve the stability of the read reference current.

In the first variation, the metal source lines of the first group are longer than those of the second group, but the current losses induced by this difference are negligible.

That which is claimed is:

1. An electrically erasable and programmable non-volatile memory comprising:

a plurality of word columns, each column comprising a
first group of n memory cells ranked 0 to n−1 and a
second group of n memory cells ranked 0 to n−1, the
first and second groups of memory cells each comprising at least one transistor including a conduction terminal;

a first group of word lines connected to the first group of
memory cells;

a second group of word lines connected to the second
group of memory cells such that a read access to a word
in the first group of memory cells leads to selection of
a corresponding word in the second group of memory
cells;

n bit lines ranked 0 to n−1 connected to the first group of
memory cells having the same ranking;

a first group of diffusion connections for each column;

a first group of diffusion lines connected to the conduction
terminals of the first group of memory cells via the first
group of diffusion connections for each column;

a second group of diffusion connections for each column;

a second group of diffusion lines connected to the conduction terminals of the second group of memory cells
via the second group of diffusion connections for each
column, a length of connection between a conduction
terminal of a memory cell connected to an i ranked bit
line in the second group of memory cells and a respective second diffusion connection corresponding to a
length of connection between a conduction terminal of
a memory cell connected to an (n−1)−i ranked bit line
in the first group of memory cells and a respective first
diffusion connection; and a connection transistor connected to the first and second
groups of diffusion connections for each column.

2. A memory according to claim 1, wherein the n bit lines ranked 0 to n−1 are connected to the second group of memory cells having the same ranking; the memory further comprising:

a first conducting line connected between the first group
of diffusion connections and the connection transistor
for each column; and a second conducting line connected between the second
group of diffusion connections and the connection
transistor for each column.

3. A memory according to claim 2, wherein each column is in a layout zone; and wherein the first and second conducting lines are on opposite sides of the layout zone.

4. A memory according to claim 1, further comprising:

a conducting line connected between the first and second
groups of diffusion connections and the connection
transistor for each column; and a multiplexer connected to the n bit lines between the first
and second groups of memory cells for connecting the
i ranked bit line connected to a memory cell in the first
group of memory cells to the (n−1)−i ranked bit line
connected to a memory cell in the second group of
memory cells.

5. A memory according to claim 4, wherein each column is in a layout zone; and wherein the conducting line is outside the layout zone.

6. A memory according to claim 1, further comprising at least one column of read reference cells for the plurality of word columns.

7. A memory according to claim 1, wherein the first and second groups of memory cells each form a half-array of the memory.

8. A memory according to claim 1, wherein the memory cells of the second group are all in a same programmed state.

9. A memory according to claim 1, wherein the at least one transistor of each memory cell comprises a floating gate.

10. A memory comprising:

a plurality of word columns, each column comprising a
first group of n memory cells ranked 0 to n−1 and a
second group of n memory cells ranked 0 to n−1, the
first and second groups of memory cells each comprising at least one transistor including a conduction terminal;

a first group of word lines connected to the first group of
memory cells;

a second group of word lines connected to the second
group of memory cells such that a read access to a word
in the first group of memory cells leads to selection of
a corresponding word in the second group of memory
cells;

n bit lines ranked 0 to n−1 connected to the first and
second groups of memory cells having the same ranking;

a first group of diffusion connections for each column;

a first group of diffusion lines connected to the conduction
terminals of the first group of memory cells via the first
group of diffusion connections for each column;

a first conducting line connected to the first group of
diffusion connections for each column;

a second group of diffusion lines connected to the conduction terminals of the second group of memory cells
via a second group of diffusion connections for each
column, a length of connection between a conduction
terminal of a memory cell connected to an i ranked bit
line in the second group of memory cells and a respective second diffusion connection corresponding to a
length of connection between a conduction terminal of
a memory cell connected to an (n−1)−i ranked bit line
in the first group of memory cells and a respective first
diffusion connection; and a second conducting line connected to the second group of
diffusion connections for each column.

11. A memory according to claim 10, further comprising a connection transistor connected to the first and second conducting lines of each column.

12. A memory according to claim 10, wherein each column is in a layout zone, and wherein the first and second conducting lines are on opposite sides of the layout zone.

13. A memory according to claim 10, further comprising at least one column of read reference cells for the plurality of word columns.

14. A memory according to claim 10, wherein the first and second groups of memory cells each form a half-array of the memory.

15. A memory according to claim 10, wherein the memory cells of the second group are all in a same programmed state.

16. A memory according to claim 10, wherein the at least one transistor of each memory cell comprises a floating gate.

17. A memory according to claim 10, wherein the first and second groups of memory cells form an electrically erasable and programmable non-volatile memory.

18. A memory comprising:

a plurality of word columns, each column comprising a
first group of n memory cells ranked 0 to n−1 and a
second group of n memory cells ranked 0 to n−1, the
first and second groups of memory cells each comprising at least one transistor including a conduction terminal;

a first group of word lines connected to the first group of memory cells;

a second group of word lines connected to the second group of memory cells such that a read access to a word in the first group of memory cells leads to selection of a corresponding word in the second group of memory cells;

n bit lines ranked 0 to n−1 connected to the first group of memory cells having the same ranking;

a first group of diffusion connections for each column;

a first group of diffusion lines connected to the conduction terminals of the first group of memory cells via the first group of diffusion connections for each column;

a second group of diffusion connections for each column;

a second group of diffusion lines connected to the conduction terminals of the second group of memory cells via the second group of diffusion connections for each column;

a multiplexer connected to the n bit lines between the first and second groups of memory cells for connecting an i ranked bit line connected to a memory cell in the first group of memory cells to an (n−1)-i ranked bit line connected to a memory cell in the second group of memory cells so that a length of connection between a conduction terminal of a memory cell connected to the i ranked bit line in the second group of memory cells and a respective second diffusion connection corresponding to a length of connection between a conduction terminal of a memory cell connected to an (n−1)-i ranked bit line in the first group of memory cells and a respective first diffusion connection; and a conducting line connected to the first and second groups of diffusion connections for each column.

19. A memory according to claim 18, further comprising a connection transistor connected to the conducting line for each column.

20. A memory according to claim 18, wherein each column is in a layout zone; and wherein the conducting line is outside the layout zone.

21. A memory according to claim 18, further comprising at least one column of read reference cells for the plurality of word columns.

22. A memory according to claim 18, wherein the first and second groups of memory cells each form a half-array of the memory.

23. A memory according to claim 18, wherein the memory cells of the second group are all in the same programmed state.

24. A memory according to claim 18, wherein the at least one transistor of each memory cell comprises a floating gate.

25. A memory according to claim 18, wherein the first and second groups of memory cells form an electrically erasable and programmable non-volatile memory.

* * * * *

UNITED STATES PATENT AND TRADEMARK OFFICE
CERTIFICATE OF CORRECTION

PATENT NO. : 6,275,413 B1
DATED : August 14, 2001
INVENTOR(S) : David Naura

It is certified that error appears in the above-identified patent and that said Letters Patent is hereby corrected as shown below:

<u>Column 4,</u>
Line 10, delete "$\Delta I = i7-i0= (\mathbf{28}a+126a^{2+210}a^{3+165}a^{4+66}a^{5+13}a^6+a^7)\ i0,$" insert
-- $\Delta I = i7-i0= (28a+126a^2+210a^3+165a^4+66a^5+13a^6+a^7)\ i0,$ --

Signed and Sealed this

Twenty-sixth Day of March, 2002

*Attest:*

*Attesting Officer*

JAMES E. ROGAN
*Director of the United States Patent and Trademark Office*